United States Patent [19]

Fleury et al.

[11] Patent Number: 4,566,024

[45] Date of Patent: Jan. 21, 1986

[54] MATRIX INFRARED DETECTOR

[75] Inventors: Joël J. Fleury, Lille; Jacques H. P. Maille, Paris, both of France

[73] Assignee: Societe Anonyme de Telecommunications, Paris, France

[21] Appl. No.: 405,886

[22] Filed: Aug. 6, 1982

[30] Foreign Application Priority Data

Mar. 12, 1982 [FR] France ................................ 82 04259

[51] Int. Cl.[4] ............................................. H01L 31/14
[52] U.S. Cl. ........................................ 357/32; 357/30; 357/31; 357/40; 357/45; 357/20; 250/330; 250/332; 250/370
[58] Field of Search ................... 357/30, 30 D, 30 G, 357/30 H, 45, 40, 20, 31, 32; 250/332, 330, 370 G

[56] References Cited

U.S. PATENT DOCUMENTS

| | | | |
|---|---|---|---|
| 3,179,542 | 4/1965 | Quinn et al. | 357/45 X |
| 3,742,238 | 6/1973 | Hoffman, II | 250/332 |
| 3,963,926 | 6/1976 | Borrello | 250/332 X |
| 4,030,116 | 6/1977 | Blumenfeld | 357/32 |
| 4,039,833 | 8/1977 | Thom | 357/45 X |
| 4,257,057 | 3/1981 | Cheung et al. | 250/370 G X |
| 4,441,791 | 4/1984 | Hornbeck | 357/30 X |

FOREIGN PATENT DOCUMENTS

| | | | |
|---|---|---|---|
| 0068684 | 5/1980 | Japan | 357/30 H |
| 0073984 | 5/1982 | Japan | 357/30 B |

OTHER PUBLICATIONS

Kohn et al., "1-2 Micron (Hg,Cd) Te Photodetectors", *IEE Transactions on Electron Devices*, vol. ED-16, No. 10, Oct. 1969, pp. 885-890.

*Primary Examiner*—Andrew J. James
*Assistant Examiner*—William A. Mintel
*Attorney, Agent, or Firm*—Holman & Stern

[57] ABSTRACT

The detector of the invention comprises a first semiconductor wafer of type n, or p, with zones of type p, or n, extending from one to the other of the two faces of the wafer, and a second wafer for processing the signals delivered by the wafer exposed to the infrared radiation. The zones of the first wafer are connected to the face of the second wafer facing the first wafer by studs extending along the face of the first wafer facing the second wafer. The invention makes it possible to obtain an infrared detector for a camera which is quick and economical to manufacture.

8 Claims, 12 Drawing Figures

MATRIX INFRARED DETECTOR

BACKGROUND OF THE INVENTION

The present invention relates to a matrix infrared detector comprising a matrix of infrared elements, particularly for a camera, for example for aerial reconnaissance.

The advantage of such matrix detectors lies in the fact that addressing, or scanning, of the elements of the matrix is effected electronically, and no longer mechanically, by a luminous spot.

Addressing consists, in fact, with the aid of electronic processing means, either of integrating the signals delivered by the elements of the matrix, or of sequentially commuting the elements of the matrix on a circuit for reading the signals delivered. It will therefore be readily appreciated that each of the elements of the matrix is connected to these electronic processing means.

To obtain the optimal conditions of operation and sensitivity, the matrix of infrared elements must operate at low temperature.

Thus, for spectral bands of 3 to 5 $\mu$m or of 8 to 12 $\mu$m, for example, the optimal temperature is 77° K. for the detector made of Hg Cd Te or In Sb.

It has therefore been proposed to dispose the matrix of elements on a cooled surface, in a cryogenic enclosure.

It was firstly proposed to couple the elements of the matrix to electronic processing circuits, outside the cryogenic enclosure, by connections. However, this solution presents drawbacks due to the length of the connection lines, in which parasitic noises are created, and to the number of such lines, which presents a thermal load due to line losses. Furthermore, this solution leads to detection modules of large dimensions, with a large number of elementary solders.

It was then proposed to dispose the matrix of infrared elements and the electronic circuits on the same cold surface, inside the cryogenic circuit.

However, the dimensions of this surface are necessarily limited by the power of the coolers. This latter solution therefore led to adopting, as electronic processing circuits, integrated circuits of silicon, of which mastery was acquired, making it possible to gather together on a small surface a large number of electric functions, with photovoltaic, and not photoconductor, infrared elements, for reasons of impedance matching, with a very large number of sensivive elements.

Two solutions were then possible: Either dispose the matrix of infrared elements and the silicon circuit one beside the other, or dispose the matrix above the silicon circuit.

The first of these solutions did not offer a decisive advantage either from the point of view of dimensions or from the manufacturing standpoint.

By adopting the second solution, it was still possible to opt either for a technology in which illumination of the matrix by the radiations is effected by the face bearing the detector diodes, i.e. the front face remote from the silicon circuit, or for a technology with illumination by the rear face, opposite the one bearing the diodes.

In rear face illumination technology, the difficulty of making a monocrystalline, for example Hg Cd Te, detector layer on a substrate transparent to the radiations is encountered. In this case, as the sensitive elements are adjacent the silicon circuit, the connections by cold welding between the studs for connecting the silicon circuit and the detector layer, for example of indium, may, of course, easily be effected.

In front face illumination technology, orifices are made in the monolithic active wafer to produce, by thin layers, links between the zones of the wafer with doping different from that of the rest of the wafer and defining the diodes of the wafer, and the input studs of the silicon circuit, to the rear of the wafer, thus creating islands of detector material relatively offset with respect to one another to allow connections on the silicon circuit. In this case, the ratio between the surface of the active portion and the total surface of the wafer, i.e. the coefficient of occupation, is low. In addition, this island structure is very fragile. Finally, and as in the rear face illumination technology, it is difficult to make a large number of connections.

It is an object of the invention to overcome the drawbacks of this front face illumination technology.

SUMMARY OF THE INVENTION

To this end, the present invention relates to a matrix infrared detector comprising a first semi-conductor wafer of either the p-type or n-type having zones of the other type defined therein, the zones extending from a first face of the wafer which is adapted to be exposed to infrared radiations. The zones define interfaces and form a matrix of detector elements. A second semi-conductor/wafer has a face which is directed toward the opposite or second face of the first wafer. At least one integrated circuit is included in the second wafer for processing the signals delivered by the detector elements of the matrix in the first wafer. Solder studs connect the zones of the first wafer to the face of the second wafer which faces the first wafer. The detector is characterised in that the zones of the first wafer extend from one to the other of the two faces of the first wafer, and the solder studs extend along the face of the first wafer which faces the second wafer.

Due to the invention, it has therefore been possible to transfer the contacts of the solder studs with the zones of the other type of the first wafer, from the front face thereof, the one exposed to the radiations, to the rear face. This feature offers two advantages: The first, which is, moreover, that of non-monolithic rear face illumination technology, lies in the fact that the connections between the detection wafer and the processing wafer are as short as possible. The second, the most important, lies in the fact that these connections may be made collectively in one operation.

It will be noted that Applicants have developed their invention starting on the one hand from photovoltaic detectors and silicon processing circuits and, on the other hand, from detectors cooled in a cryogenic enclosure. It is clear that they do not intend to limit the scope of their invention to such detectors, and that it extends to all detectors with front face illumination of which the connections with the processing circuits are made on the rear face. In fact, it is not necessary that said invention be applied to cooled detectors, of high sensitivity, or to detectors with silicon processing circuits, for the progress obtained by this invention to be significant. The invention is sufficient per se since the interfaces simultaneously perform the functions of detection and of connection with the rear face.

In the first embodiment of the detector of the invention, the first detection wafer is solid.

In a second embodiment of the detector of the invention, the first detection wafer has a structure comprising orifices from one to the other of its two faces, and the zones of the other type extend along the walls of the orifices.

In this embodiment, the drawbacks of the relative smallness of the coefficient of occupation and of the fragility of the structure, which do exist, are nevertheless eclipsed by the advantages of the invention.

In this case, the walls of the orifices may be metallized or the orifices may be filled reinforced epoxy resin to ensure connections.

BRIEF DESCRIPTION OF THE DRAWINGS

The invention will be more readily understood on reading the following description with reference to the accompanying drawings, in which.

The different phases of the process of manufacture of the first embodiment of detection wafer will firstly be described, with reference to FIGS. 1 to 6.

DETAILED DESCRIPTION OF A PREFERRED EMBODIMENT OF THE INVENTION

A solid substrate 1 is taken (FIG. 1), for example made of Hg Cd Te which is a semi-conductor material highly appropriate for detecting objects or landscapes in the spectral bands of 3 to 5 $\mu$m and 8 to 12 $\mu$m, although the invention is not limited to such a material. The substrate 1 is more precisely of p type, although a substrate of n type could also have been taken.

Figure 1:
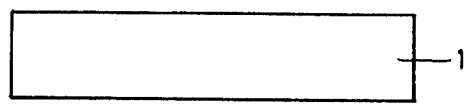
FIGS. 1 to 5 show a first embodiment of the detection and connection wafer of the detector according to the invention, in its different phases of manufacture.
Figure 2:
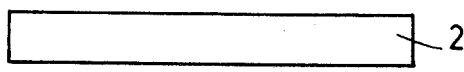

The substrate 1 is then made thinner, by known means, for example by polishing, to obtain a wafer 2, with a thickness of from 20 to 30 $\mu$m in the present case (FIG. 2).

Figure 3:
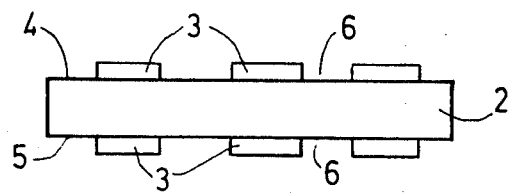

A masking layer, ZnS in the present case, is deposited on the two faces 4 and 5 of the wafer 2, and openings are made in these two layers to form, on each of the faces, masking bands 3 disposed in matrix manner and, between these bands, windows 6 is mosaic configuration. The windows, and therefore the masking bands, of the two faces are respectively opposite one another (FIG. 3).

Figure 4:
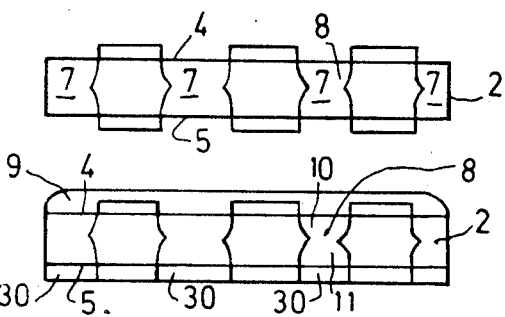

From windows 6, a diffusion of n type is effected simultaneously from the two faces 4 and 5 of the wafer 2, to obtain zones 7 of n type extending from face 4 to face 5 of the wafer 2 (FIG. 4). These n type zones 7 are in the form of channels presenting a median portion 8, due to the "planar" diffusion technique carried out in the present case.

If an n type substrate had been taken at the beginning, a p type diffusion would, of course, have then been effected.

The face 4 of the wafer 2 is the one intended to be exposed to the infra-red radiations to be detected.

This detection is effected by the mosaic of the elementary photodiodes created by the n type zones 7 in the p type substrate of the wafer 2.

Although the wafer 2 described up to now is substantially symmetrical with respect to its median plane, its face 4 will be called the front face, and therefore face 5 the rear face, on the one hand, because it is face 4 which will be exposed to radiations and, on the other hand, because the detector interfaces extend in any case from this face 4, by analogy with the vocabulary used in connection with the conventional front face illumination technology.

Apart from the fact that the plane of the interfaces thus defined is substantially parallel to the direction of the radiations to be received, these interfaces are therefore noteworthy in that they extend from the front face 4 to the rear face 5 of the wafer 2.

Figure 5:
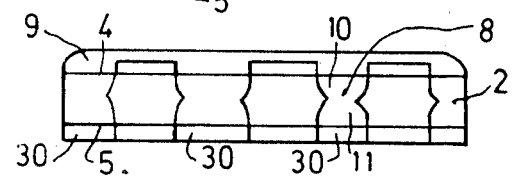

The front face 4 of the wafer 2 is then covered with a protection or passivation layer 9 (FIG. 5). A metallizing layer, preferably indium, is then deposited in the windows 6 of the rear face 5, along the n type zones, collectively in one operation, in order to make studs 30 for connection of the n type zones of the photodiodes, adapted to be connected by cold welding with corresponding input studs 31 of a silicon integrated circuit for processing the signals delivered by the pn interfaces of the wafer 2 (FIG. 5).

The single stud for connecting the p type zones of the wafer, to be connected with a corresponding stud of the silicon processing circuit, may be formed at any spot in the mass of the wafer 2, but preferably on the rear face 5.

The n type zones are composed of a first detection space 10, formed by diffusion from the front face 4, and a second connection space 11, formed by diffusion from the rear face 5, these two spaces being connected by the median portion 8 for electrical coupling.

The characteristics of the photodiodes thus obtained by double face diffusion are similar to those of photodiodes obtained by single face diffusion, due to the small thickness of the wafer 2, making it possible to obtain interface surfaces comparable to those of the interfaces diffused by one face.

The coefficient of occupation is limited only by the electronic characteristics of the starting material, Hg Cd Te, and therefore by the possibilities of diffusion of the electric carriers. It may reach 70% for square sensitive surfaces exposed to the radiations, measuring 50 $\mu$m.

Figure 6:
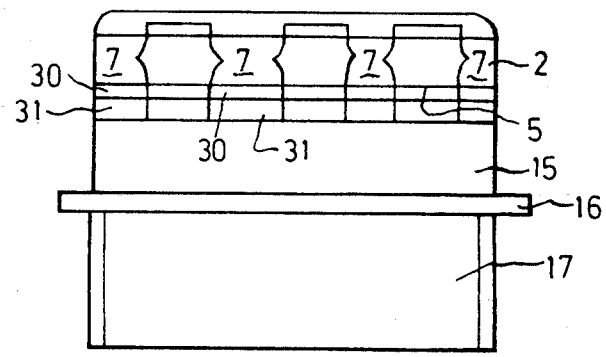
FIG. 6 shows a schematic view of the detector of the invention with the detection and connection wafer of FIGS. 1 to 5, and FIGS. 7 to 12 show a second embodiment of the detection and connection wafer of the detector of the invention.
Figure 7:
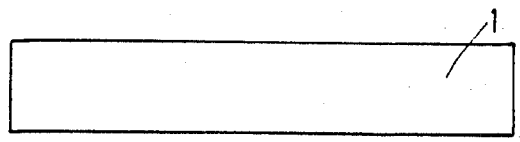
Figure 8:
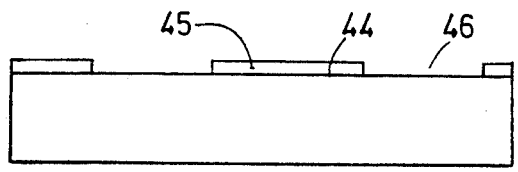

Having prepared the detection and connection wafer, it then remains: to take a second silicon wafer 15 for processing the signals delivered by the photodiodes of the first wafer 2 (which does not form part of the present invention as it is perfectly well known to the man skilled in the art and which will therefore not be described in greater detail), to form the indium connection studs 31 adapted to be connected to the studs 30 of the rear face 5 of the wafer 2, in connecting the studs of the two wafers in two's by cold welding, to connect the zones 7 of n type and the mass of p type of the wafer 2 to the circuit of the wafer 15, and to dispose the two wafers 2 and 15 on a cooled surface 16, in a cryogenic enclosure 17 (FIG. 6).

It will be noted that, due to the good thermal transfer of the silicon wafer 15, cooling of the detection and connection wafer 2, separated from the cold surface 16 by the wafer 15, is still ensured.

Finally, if the connection between wafers 2 and 15 is effected by a very large number of connections, output of the silicon wafer is effected by a much smaller number of output studs (not shown).

Figure 9:
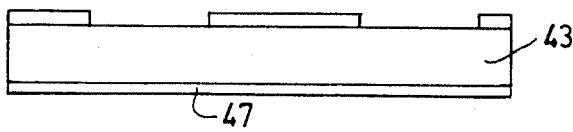
Figure 10:
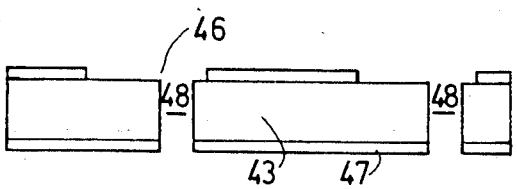
Figure 11:
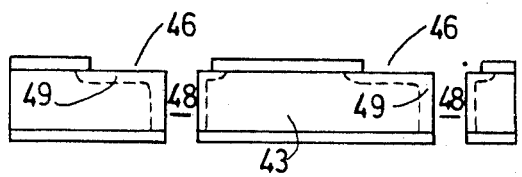
Figure 12:
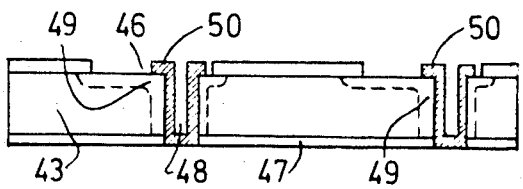

Referring to FIGS. 7 to 12, which relate to the second embodiment of the detector of the invention, a substrate 1, for example of Hg Cd Te, of "p" type, it taken. A masking layer 45 is deposited on the front face 44 of this substrate. By photoengraving this masking layer, windows 46 are formed. The wafer is then made thinner by polishing its rear face in order to obtain a wafer 43 of about 20 to 30 μm thickness. A masking layer 47 is deposited on the rear face of this wafer (FIG. 9). Inside the windows 46 are pierced, by ionic engraving, holes 48 which are preferably 10 μm by 10 μm, passing through the wafer as well as the masking layer 47 deposited on the rear face. A diffusion of "n" type is then effected. A zone 49 of "n" type is developed under the window 46 and along the wall of the holes 48, therefore from the front face to the rear face of the wafer 43 (FIG. 11). The link between zone "n" of the detector thus made and the corresponding input stud of the silicon circuit is obtained by deposit of a metal layer 50 (FIG. 12). Such a deposit may be effected by electrolysis. The holes 48 may also be filled with a reinforced epoxy resin to perform this same function of connection.

In addition, the wafer 43, described with reference to FIGS. 7 to 12, is adapted to be mounted, like the wafer 2 of FIGS. 1 to 5, on the cold surface of a cryogenic enclosure, with the interposition of a silicon processing wafer.

With this second embodiment of the detector of the invention, this is diffused hole technology, similar to the "metallized hole" technology which is, moreover, currently used.

What is claimed is:

1. Matrix infrared detector comprising:
   a first solid semi-conductor wafer of one of two types: p and n, said first wafer having first and second faces;
   zones of the other of the two types p and n in the first wafer, extending from said first face which is adapted to be exposed to infrared radiations, thereby defining interfaces and forming a matrix of detector elements;
   a second semi-conductor wafer having a third face which faces the second face of the first wafer, said second wafer comprising integrated circuit means for processing the signals delivered by the detector elements of the matrix of the first wafer; and
   solder studs connecting said zones of the first wafer to the third face of the second wafer;
   said zones of the first wafer extending from the first to the second faces of the first wafer, each zone being in the form of a channel comprising a detection space extending from the first face, and a connection space extending form the second face of the first wafer;
   said solder studs extending along the second face of the first wafer facing the second wafer.

2. The infrared detector of claim 1, characterised in that the first wafer is a semiconductor of p type and said zones are diffused zones of n type.

3. The infrared detector of claims 1 or 2, characterised in that the first wafer is a semiconductor of n type and said zones are diffused zones of p type.

4. The infrared detector of claim 3, characterised in that the first wafer is made of Hg Cd Te.

5. The infrared detector of claim 4, characterised in that the second wafer is made of silicon.

6. The infrared detector of claim 3, characterised in that the second wafer is made of silicon.

7. The infrared detector of claim 1 or claim 12, characterised in that the first wafer is made of Hg Cd Te.

8. The infrared detector of claim 7, characterised in that the second wafer is made of silicon.

* * * * *